United States Patent
Abernathy et al.

(10) Patent No.: US 7,939,125 B2
(45) Date of Patent: May 10, 2011

(54) VISCOUS MATERIAL NONCONTACT JETTING SYSTEM

(75) Inventors: Ron Abernathy, Vista, CA (US); Alec J. Babiarz, Leucadia, CA (US); Nicholas Anthony Barendt, Fairview Park, OH (US); Robert Ciardella, Ranch Santa Fe, CA (US); James Everett Cooper, Jr., Vista, CA (US); Kenneth S. Espenschied, Olmsted Township, OH (US); Erik Fiske, Carlsbad, CA (US); Christopher L. Giusti, San Marcos, CA (US); Patrick R. Jenkins, Carlsbad, CA (US); Alan Lewis, Carlsbad, CA (US); Raymond Andrew Merritt, San Diego, CA (US); Naoya Ian Nagano, Oceanside, CA (US); Horatio Quinones, Carlsbad, CA (US); Thomas Ratledge, San Marcos, CA (US); Joe Sherman, Fallbrook, CA (US); Floriana Suriawidjaja, Carlsbad, CA (US); Todd Weston, Vista, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 12/940,360

(22) Filed: Nov. 5, 2010

(65) Prior Publication Data
US 2011/0048575 A1 Mar. 3, 2011

Related U.S. Application Data

(63) Continuation of application No. 10/838,508, filed on May 4, 2004, now abandoned.

(60) Provisional application No. 60/473,166, filed on May 23, 2003.

(51) Int. Cl.
*C23C 16/52* (2006.01)
(52) U.S. Cl. ............ 427/8; 427/256; 427/287; 118/323; 118/712
(58) Field of Classification Search ................ 427/8, 96, 427/256, 287, 421; 118/323, 712
See application file for complete search history.

(56) References Cited

U.S. PATENT DOCUMENTS
6,541,063 B1 * 4/2003 Prentice et al. .................. 427/8

* cited by examiner

*Primary Examiner* — Michael Kornakov
*Assistant Examiner* — Xiao Zhao
(74) *Attorney, Agent, or Firm* — Wood, Herron & Evans, L.L.P.

(57) ABSTRACT

A viscous material noncontact jetting system has a jetting dispenser mounted for relative motion with respect to a surface. A control is operable to cause the jetting dispenser to jet a viscous material droplet that is applied to the surface as a viscous material dot. A device, such as a camera or weigh scale, is connected to the control and provides a feedback signal representing a size-related physical characteristic of the dot applied to the surface. The size-related physical characteristics of subsequently applied dots is controlled by heating and cooling, or adjusting a piston stroke in the jetting dispenser, in response to the size-related physical characteristic feedback. Dispensed material volume control and velocity offset compensation are also provided.

7 Claims, 7 Drawing Sheets

VISCOUS MATERIAL NONCONTACT JETTING SYSTEM

CROSS-REFERENCE TO RELATED APPLICATIONS

This application is a continuation of U.S. application Ser. No. 10/838,508, filed May 4, 2004 (pending) which claims the benefit of U.S. Application Ser. No. 60/473,166, filed on May 23, 2003, the disclosures of which are hereby incorporated by reference herein.

FIELD OF THE INVENTION

The present invention generally relates to equipment for dispensing viscous materials and more particularly, to a computer controlled, noncontact jetting system for applying dots of viscous material onto a surface.

BACKGROUND OF THE INVENTION

In the manufacture of substrates, for example, printed circuit ("PC") boards, it is frequently necessary to apply small amounts of viscous materials, i.e. those with a viscosity greater than fifty centipoise. Such materials include, by way of example and not by limitation, general purpose adhesives, solder paste, solder flux, solder mask, grease, oil, encapsulants, potting compounds, epoxies, die attach pastes, silicones, RTV and cyanoacrylates.

In the quest for ever increasing miniaturization of circuitry, a fabrication process known as flip chip technology has developed, which has multiple processes that require viscous fluid dispensing. For example, a semiconductor die or flip chip is first attached to a PC board via solder balls or pads, and in this process, a viscous solder flux is applied between the flip chip and the PC board. Next, a viscous liquid epoxy is allowed to flow and completely cover the underside of the chip. This underfill operation requires that a precise amount of the liquid epoxy be deposited in a more or less continuous manner along at least one side edge of the semiconductor chip. The liquid epoxy flows under the chip as a result of capillary action due to the small gap between the underside of the chip and the upper surface of the PC board. Once the underfill operation is complete, it is desirable that enough liquid epoxy be deposited to encapsulate all of the electrical interconnections, so that a fillet is formed along the side edges of the chip. A properly formed fillet ensures that enough epoxy has been deposited to provide maximum mechanical strength of the bond between the chip and the PC board. Thus, underfilling with the epoxy serves first, as a mechanical bond to help reduce stress and limit strain on the interconnecting solder pads during thermal cycling and/or mechanical loading and second, protects the solder pads from moisture and other environmental effects. It is critical to the quality of the underfilling process that the exact amount of epoxy is deposited at exactly the right location. Too little epoxy can result in corrosion and excessive thermal stresses. Too much epoxy can flow beyond the underside of the chip and interfere with other semiconductor devices and interconnections.

In another application, a chip is bonded to a PC board. In this application, a pattern of adhesive is deposited on the PC board; and the chip is placed over the adhesive with a downward pressure. The adhesive pattern is designed so that the adhesive flows evenly between the bottom of the chip and the PC board and does not flow out from beneath the chip. Again, in this application, it is important that the precise amount of adhesive be deposited at exact locations on the PC board.

The PC board is often being carried by a conveyor past a viscous material dispenser that is mounted for two axes of motion above the PC board. The moving dispenser is capable of depositing dots of viscous material at desired locations on the PC board. There are several variables that are often controlled in order to provide a high quality viscous material dispensing process. First, the weight or size of each of the dots may be controlled. Known viscous material dispensers have closed loop controls that are designed to hold the dot size constant during the material dispensing process. It is known to control the dispensed weight or dot size by varying the supply pressure of the viscous material, the on-time of a dispensing valve within the dispenser and the stroke of an impact hammer in a dispensing valve. Each of those control loops may have advantages and disadvantages depending on the design of a particular dispenser and the viscous material being dispensed thereby. However, those techniques often require additional components and mechanical structure, thereby introducing additional cost and reliability issues. Further, the responsiveness of those techniques is proving less satisfactory as the rate at which dots are dispensed increases. Therefore, there is a continuing need to provide better and simpler closed loop controls for controlling dot size or weight.

A second important variable that may be controlled in the dispensing process is the total amount or volume of viscous material to be dispensed in a particular cycle. Often the designer of a chip specifies the total amount or volume of viscous material, for example, epoxy in underfilling, or adhesive in bonding, that is to be used in order to provide a desired underfilling or bonding process. For a given dot size and dispenser velocity, it is known to program a dispenser control, so that the dispenser dispenses a proper number of dots in order to dispense a specified amount of the viscous material in a desired line or pattern at the desired location on the PC board. Such a system is reasonably effective in a world in which the parameters that effect the dispensing of the viscous material remain constant. However, such parameters are constantly changing, albeit, often only slightly over the short term; but the cumulative effect of such changes can result in a detectable change in the volume of fluid being dispensed by the dispenser. Therefore, there is a need for a control system that can detect changes in dispensed weight and automatically adjust the dispenser velocity, so that the desired total volume of viscous material is uniformly dispensed over a whole dispensing cycle.

A third important variable relates to the timing of dispensing dots of viscous material on-the-fly. When dispensed on-the-fly, the dots of viscous material fly horizontally through the air prior to landing on the PC board. In order to accurately locate the dots on the PC board, it is known to perform a calibration cycle in which a time based compensation value is determined and used to pre-trigger the dispenser. Again, there is a need to continue to improve the process by which an on-the-fly dispenser can dispense dots of viscous material, so that they are more accurately located on the PC board.

Therefore, there is a need for an improved computer controlled viscous fluid dispensing system that addresses the needs described above.

SUMMARY OF THE INVENTION

The present invention provides an improved noncontact jetting system that more accurately applies, on-the-fly, viscous material dots on a substrate. First, the improved noncontact jetting system of the present invention permits dispensed weight or dot size to be adjusted by changing either the temperature of the nozzle or the stroke of a piston in the jetting valve. This provides a simpler and less expensive system with a faster response time for calibrating dispensed weight or dot size. Further, the improved noncontact jetting system of the present invention permits a relative velocity between a nozzle and the substrate to be automatically optimized as a function of a current material dispensing characteristics and a specified total volume of material to be used on the substrate. The result is a more accurate and uniform application of the dispensed viscous material on the substrate. In addition, the improved noncontact jetting system of the present invention optimizes the positions at which respective dots are to be dispensed as a function of the relative velocity between the nozzle and the substrate, so that viscous material dots dispensed on-the-fly are accurately located on the substrate. The improved noncontact jetting system of the present invention is especially useful in those applications where weight or volume of the viscous material dots and their location on the substrate require accurate and precise control.

According to the principles of the present invention and in accordance with the described embodiments, the invention provides a viscous material noncontact jetting system with a jetting dispenser mounted for relative motion with respect to a surface. A control is connected to the jetting dispenser and has a memory for storing a desired size-related physical characteristic of a dot of viscous material. The control is operable to cause the jetting dispenser to apply dots of viscous material onto the surface. A device is connected to the control and provides a feedback signal representing a detected size-related physical characteristic of the dot applied to the surface. A temperature controller has a first device for increasing the temperature of the nozzle and a second device for decreasing the temperature of the nozzle. The control is operable to cause the temperature controller to change a temperature of the nozzle in response to a difference between the detected size-related physical characteristic and the desired size-related physical characteristic.

In different aspects of this invention, the size-related physical characteristic is determinative of either a diameter, a weight or a volume of the dots applied to the surface. In another aspect of this invention, the device is a camera; and in a further aspect of this invention, the device is a weigh scale. Other aspects of this invention include methods of operating either a first device that increases the temperature of the nozzle or a second device that decreases the temperature of the nozzle in response to the difference between the detected size-related physical characteristic and the desired size-related physical characteristic.

In another embodiment of the invention, control is operable to first cause a piston in the jetting dispenser to move through a stroke away from a seat and thereafter, cause the piston to move through the stroke toward the seat to jet a droplet of viscous material through the nozzle. The droplet is applied to the surface as a dot of viscous material. The control is further operable to increase or decrease the stroke of the piston in response to the feedback signal representing a size-related physical characteristic of the dot that is respectively, less than, or greater than, the desired dot size value. In another aspect of this invention, the device is a camera; and in a further aspect of this invention, the device is a weigh scale. In other aspects of this invention, methods are used to increase or decrease the stroke of the piston in response to the size-related physical characteristic of the dot applied to the surface being respectively, less than, or greater than, a desired value.

In a still further embodiment of the invention, the control stores a total volume value representing a total volume of the viscous material to be dispensed and a length value representing a length over which the total volume of viscous material is to be dispensed. The control is operable to cause the jetting dispenser to apply dots of viscous material to the surface. The device provides a feedback signal to the control representing an amount of the viscous material contained in the dots applied to the surface. The control is responsive to the feedback signal, the volume value and the length value to determine a maximum velocity value for the relative motion between the jetting dispenser and the surface resulting in the total volume of material being uniformly dispensed over the length.

In yet another embodiment of the invention, the control is operable to cause the jetting dispenser to jet a viscous material droplet through the nozzle at a first location resulting in a dot of viscous material being applied to the surface. A camera connected to the control provides a feedback signal representing a location of a physical characteristic of the dot on the surface. The control determines a location of the dot on the surface and then, determines an offset value representing a difference between the first location and the location of the dot on the surface. The offset value is stored in the control and is used to offset coordinate values representing the first location during a subsequent jetting of viscous material.

These and other objects and advantages of the present invention will become more readily apparent during the following detailed description taken in conjunction with the drawings herein.

DETAILED DESCRIPTION OF THE INVENTION

Figure 1:
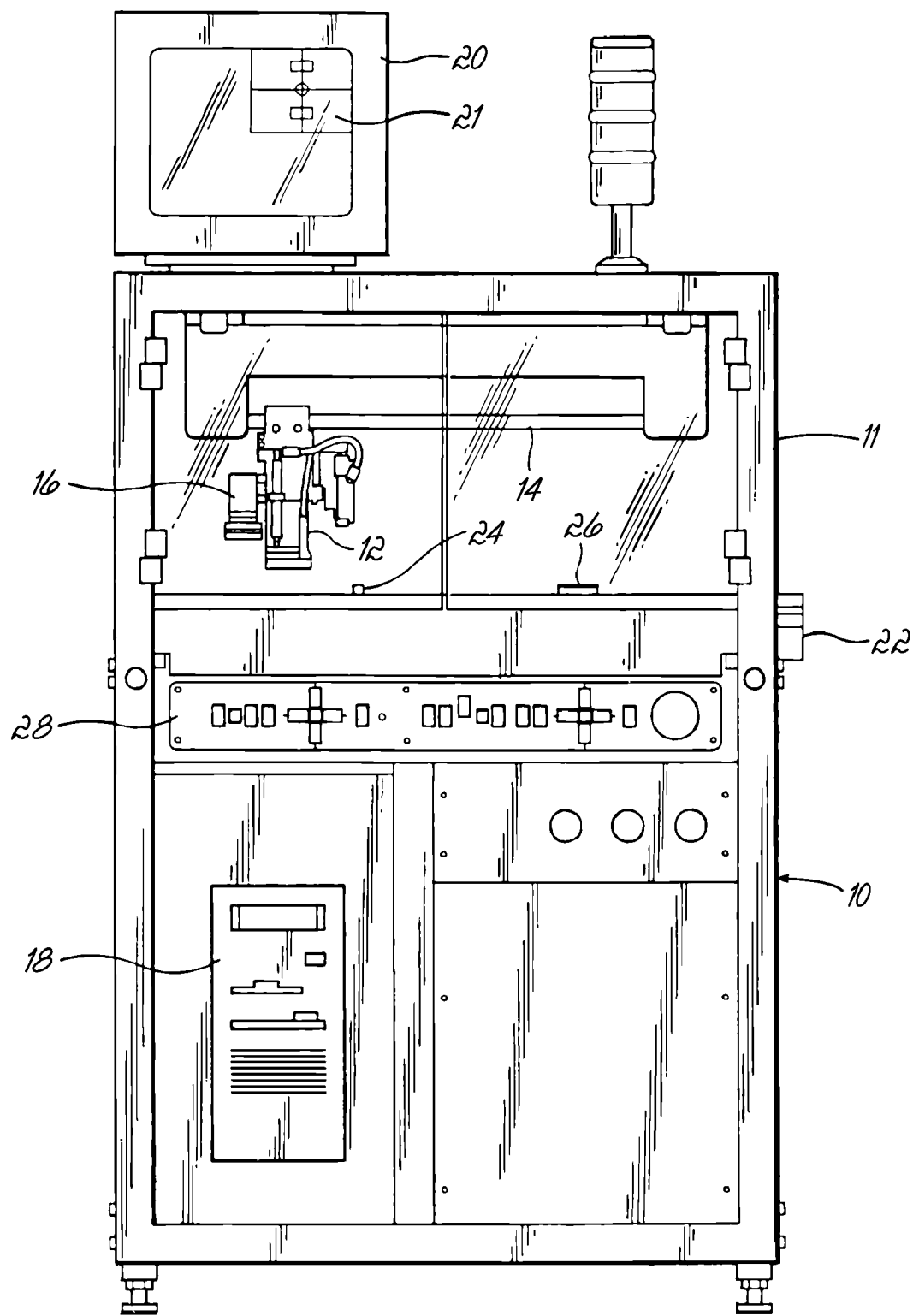
FIG. 1 is a schematic representation of a computer controlled, viscous material noncontact jetting system in accordance with the principles of the present invention.

FIG. 1 is a schematic representation of a computer controlled viscous material noncontact jetting system 10 of the type commercially available from Asymtek of Carlsbad, Calif. A rectangular frame 11 is made of interconnected horizontal and vertical steel beams. A viscous material droplet generator 12 is mounted on a Z-axis drive that is suspended from an X-Y positioner 14 mounted to the underside of the top beams of the frame 11. The X-Y positioner 14 is operated by a pair of independently controllable motors (not shown) in a known manner. The X-Y positioner and Z-axis drive provide three substantially perpendicular axes of motion for the droplet generator 12. A video camera and LED light ring assembly 16 may be connected to the droplet generator 12 for motion along the X, Y and Z axes to inspect dots and locate reference fiducial points. The video camera and light ring assembly 16 may be of the type described in U.S. Pat. No. 5,052,338 the entire disclosure of which is incorporated herein by reference.

A computer 18 is mounted in the lower portion of the frame 11 for providing the overall control for the system. The computer 18 may be a programmable logic controller ("PLC") or other microprocessor based controller, a hardened personal computer or other conventional control devices capable of carrying out the functions described herein as will be understood by those of ordinary skill. A user interfaces with the computer 18 via a keyboard (not shown) and a video monitor 20. A commercially available video frame grabber in the computer causes a real time magnified image 21 of a crosshair and dispensed dot to be displayed in a window on the monitor 20, surrounded by the text of the control software. The computer 18 may be provided with standard RS-232 and SMEMA CIM communications busses 50 which are compatible with most types of other automated equipment utilized in substrate production assembly lines.

Substrates, for example, PC boards, which are to have dots of a viscous material, for example, an adhesive, epoxy, solder, etc., rapidly applied thereto by the droplet generator 12, are manually loaded or horizontally transported directly beneath the droplet generator 12 by an automatic conveyor 22. The conveyor 22 is of conventional design and has a width which can be adjusted to accept PC boards of different dimensions. The conveyor 22 also includes pneumatically operated lift and lock mechanisms. This embodiment further includes a nozzle priming station 24 and a calibration station 26. A control panel 28 is mounted on the frame 11 just below the level of the conveyor 22 and includes a plurality of push buttons for manual initiation of certain functions during set-up, calibration and viscous material loading.

Figure 2:
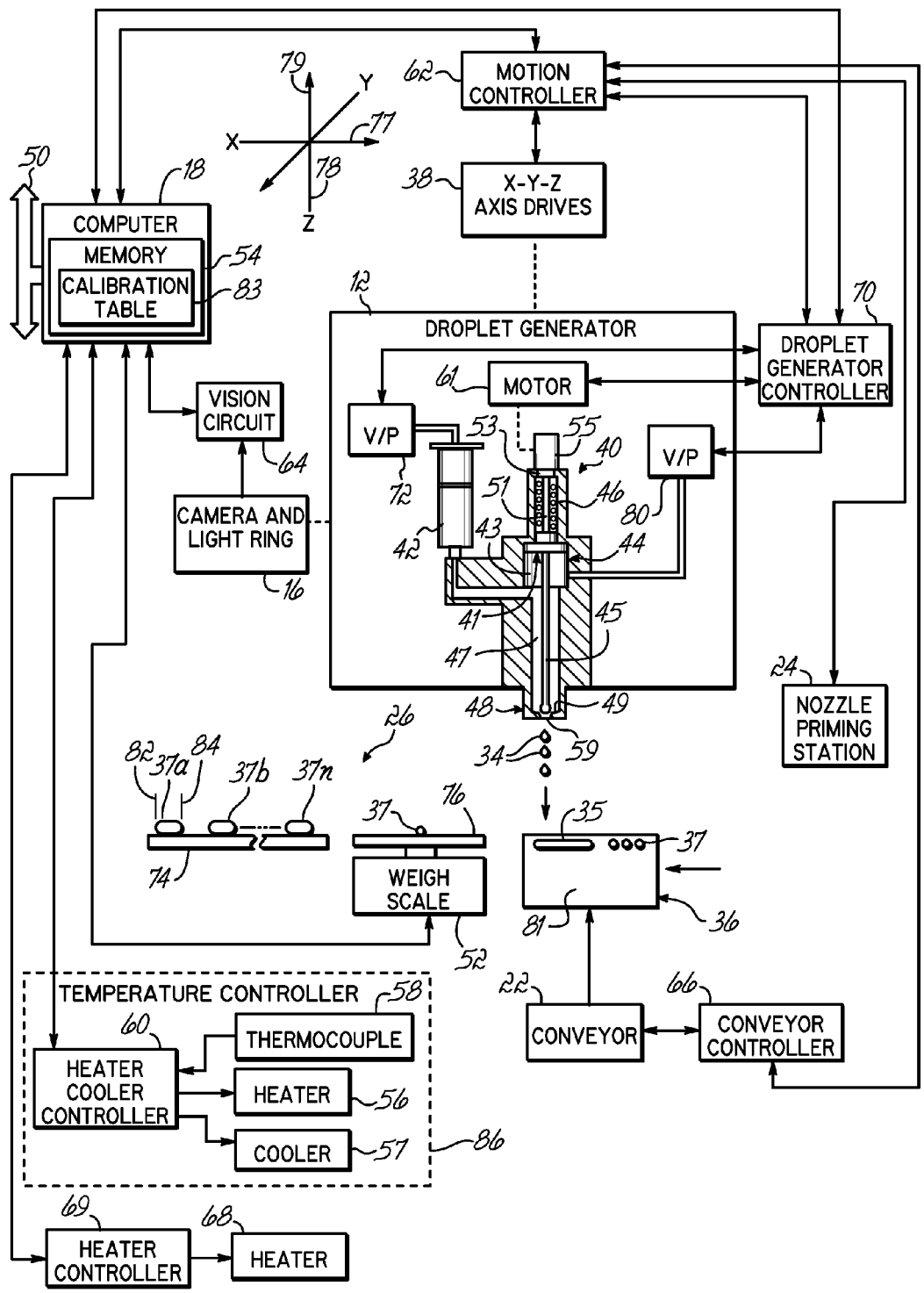
FIG. 2 is a schematic block diagram of the computer controlled, viscous material noncontact jetting system of FIG. 1.

Referring to FIG. 2, the droplet generator 12 is shown jetting droplets 34 of viscous material downwardly onto the upper surface 81 of a substrate 36, for example, a PC board. The PC board 36 is of the type designed to have components surface mounted thereon utilizing minute dots 35 of viscous material rapidly and accurately placed at desired locations. The PC board is moved to a desired position by the conveyor 22 as indicated by the horizontal arrows in FIG. 2.

Axes drives 38 are capable of rapidly moving the droplet generator 12 over the surface of the PC board 36. The axes drives 38 include the electromechanical components of the X-Y positioner 14 and a Z-axis drive mechanism to provide X, Y and Z axes of motion 77, 78, 79, respectively. Often, the droplet generator 12 jets droplets of viscous material from one fixed Z height. However, the droplet generator 12 can be raised using the Z-axis drive to dispense at other Z heights or to clear other components already mounted on the board.

The droplet generator 12 can implemented using different designs; and the specific embodiment described herein is to be considered an example, and not a limitation, of the invention. The droplet generator 12 includes an ON/OFF jetting dispenser 40, which is a non-contact dispenser specifically designed for jetting minute amounts of viscous material. The dispenser 40 may have a jetting valve 44 with a piston 41 disposed in a cylinder 43. The piston 41 has a lower rod 45 extending therefrom through a material chamber 47. A distal lower end of the lower rod 45 is biased against a seat 49 by a return spring 46. The piston 41 further has an upper rod 51 extending therefrom with a distal upper end that is disposed adjacent a stop surface on the end of a screw 53 of a micrometer 55. Adjusting the micrometer screw 53 changes the upper limit of the stroke of the piston 41. The dispenser 40 may include a syringe-style supply device 42 that is fluidly connected to a supply of viscous material (not shown) in a known manner. A droplet generator controller 70 provides an output signal to a voltage-to-pressure transducer 72, for example, an air piloted fluid regulator, one or more pneumatic solenoids, etc., connected to a pressurized source of fluid, that, in turn, ports pressurized air to the supply device 42. Thus, the supply device 42 is able to supply pressurized viscous material to the chamber 47.

A jetting operation is initiated by the computer 18 providing a command signal to the droplet generator controller 70, which causes the controller 70 to provide an output pulse to a voltage-to-pressure transducer 80, for example, an air piloted fluid regulator, one of more pneumatic solenoids, etc., connected to a pressurized source of fluid. The pulsed operation of the transducer 80 ports a pulse of pressurized air into the cylinder 43 and produces a rapid lifting of the piston 41. Lifting the piston lower rod 45 from the seat 49 draws viscous material in the chamber 47 to a location between the piston lower rod 45 and the seat 49. At the end of the output pulse, the transducer 80 returns to its original state, thereby releasing the pressurized air in the cylinder 43, and a return spring 46 rapidly lowers the piston lower rod 45 back against the seat 49. In that process, a droplet 34 of viscous material is rapidly extruded or jetted through an opening or dispensing orifice 59 of a nozzle 48. As schematically shown in exaggerated form in FIG. 2, the viscous material droplet 34 breaks away as a result of its own forward momentum; and its forward momentum carries it to the substrate upper surface 81, where it is applied as a viscous material dot 37. Rapid successive operations of the jetting valve 41 provide respective jetted droplets 34 that form a line 35 of viscous material dots on the substrate upper surface 81. As used herein, the term "jetting" refers to the above-described process for forming viscous material droplets 34 and dots 37. The dispenser 40 is capable of jetting droplets 34 from the nozzle 48 at very high rates, for example, up to 100 or more droplets per second. A motor 61 controllable by the droplet generator controller 70 is mechanically coupled to the micrometer screw 53, thereby allowing the stroke of the piston 41 to be automatically adjusted, which varies the volume of viscous material in each jetted droplet. Jetting dispensers of the type described above are more fully described in U.S. Pat. Nos. 6,253,757 and 5,747,102, the entire disclosures of which are hereby incorporated herein by reference.

A motion controller 62 governs the motion of the droplet generator 12 and the camera and light ring assembly 16 connected thereto. The motion controller 62 is in electrical communication with the axes drives 38 and provides command signals to separate drive circuits for respective X, Y and Z axes motors in a known manner.

The camera and light ring assembly 16 is connected to a vision circuit 64. This circuit drives red LEDs of a light ring for illuminating the substrate upper surface 81 and the dots 37 applied thereto. A video camera in the assembly 16 includes a charge coupled device (CCD) having an output that is converted to digital form and processed in determining both the location and size of a selected dot dispensed onto the substrate 36. A vision circuit 44 communicates with the computer 18 and to provide information thereto in both set-up and run modes.

A conveyor controller 66 is connected to the substrate conveyor 22. The conveyor controller 66 interfaces between the motion controller 62 and the conveyor 22 for controlling the width adjustment and lift and lock mechanisms of the conveyor 22. The conveyor controller 66 also controls the entry of the substrate 36 into the system and the departure therefrom upon completion of the viscous material deposition process. In some applications, a substrate heater 68 is operative in a known manner to heat the substrate and maintain a desired temperature profile of the viscous material as the substrate is conveyed through the system. The substrate heater 68 is operated by a heater controller 69 in a known manner.

The calibration station 26 is used for calibration purposes to provide a dot size calibration for accurately controlling the weight or size of the dispensed dots 37 and a dot placement calibration for accurately locating viscous material dots that are dispensed on-the-fly, that is, while the droplet generator 12 is moving relative to the substrate 36. In addition, the calibration station 26 is used to provide a material volume calibration for accurately controlling the velocity of the droplet generator 12 as a function of current material dispensing characteristics, the rate at which the droplets are to be dispensed and a desired total volume of viscous material to be dispensed in a pattern of dots, for example, in the line 35. The calibration station 26 includes a stationary work surface 74 and a measuring device 52, for example, a weigh scale, that provides a feedback signal to the computer 18 representing size-related physical characteristic of the dispensed material, which in this embodiment is the weight of material weighed by the scale 52. Weigh scale 52 is operatively connected to the computer 18; and the computer 18 compares the weight of the material with a previously determined specified value, for example, a viscous material weight setpoint value stored in a computer memory 54. Other types of devices may be substituted for the weigh scale 24 and, for example, may include other dot size measurement devices such as vision systems, including cameras, LEDs or phototransistors for measuring the diameter, area and/or volume of the dispensed material.

In this embodiment, the noncontact jetting system 10 further includes a temperature controller 86 including a heater 56, a cooler 57 and a temperature sensor 58, for example, a thermocouple, an RTD device, etc., which are disposed immediately adjacent the nozzle 48. The heater 56 may be a resistance heater that provides heat to the nozzle 48 by radiance or convection. The cooler 57 can be any applicable device, for example, a source of cooler air, a vortex cooling generator that is connected to a source of pressurized air, etc. In other embodiments, a Peltier device may be used. The specific commercially available devices chosen to provide heating and cooling will vary depending on the environment in which the noncontact jetting system 10 is used, the viscous material being used, the heating and cooling requirements, the cost of the heating and cooling devices, the design of the system, for example, whether heat shields are used, and other application related parameters. The thermocouple 58 provides a temperature feedback signal to a heater/cooler controller 60, and the controller 60 operates the heater 56 and cooler 57 in order to maintain the nozzle 48 at a desired temperature as represented by a temperature setpoint. The controller 60 is in electrical communications with the computer 18. Thus, the temperature of the nozzle 48 and the viscous material therein is accurately controlled while it is located in and being ejected from the nozzle 48, thereby providing a higher quality and more consistent dispensing process.

In operation, CAD data from a disk or a computer integrated manufacturing ("CIM") controller are utilized by the computer 18 to command the motion controller 62 to move the droplet generator 12. This ensures that the minute dots of viscous material are accurately placed on the substrate 36 at the desired locations. The computer 18 automatically assigns dot sizes to specific components based on the user specifications or a stored component library. In applications where CAD data is not available, the software utilized by the computer 18 allows for the locations of the dots to be directly programmed. In a known manner, the computer 18 utilizes the X and Y locations, the component types and the component orientations to determine where and how many viscous material dots to apply to the upper surface 81 of the substrate 36. The path for dispensing the minute viscous material droplets is optimized by aligning the in-line points. Prior to operation, a nozzle assembly is installed that is often of a known disposable type designed to eliminate air bubbles in the fluid flow path.

Figure 3:
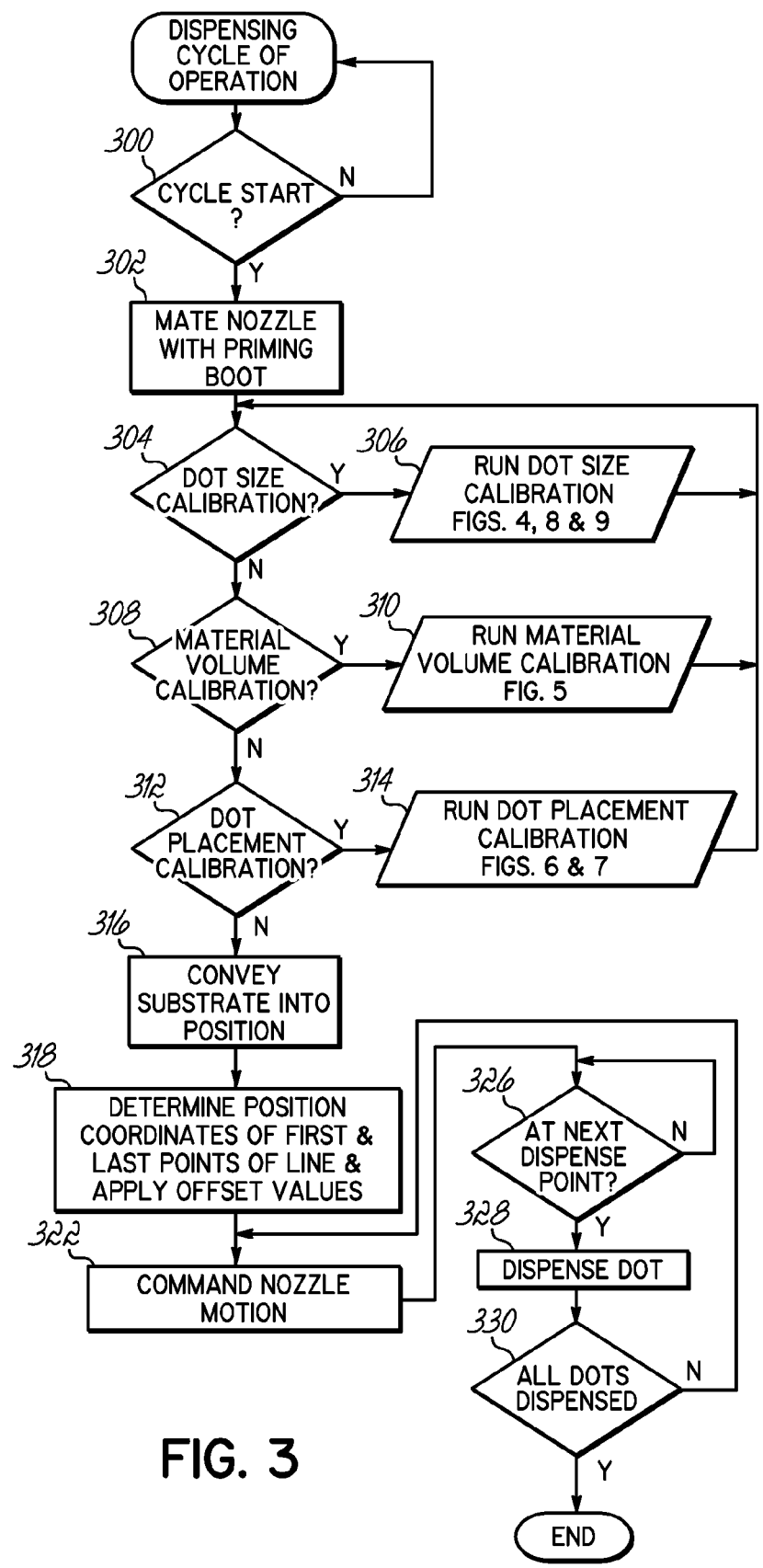
FIG. 3 is a flowchart generally illustrating a dispensing cycle of operation of the viscous material jetting system of FIG. 1.

After all of the set up procedures have been completed, a user then utilizes the control panel 28 (FIG. 1) to provide a cycle start command to the computer 18. Referring to FIG. 3, the computer 18 then begins executing a dispensing cycle of operation. Upon detecting a cycle start command, at 300, the computer 18 then provides command signals to the motion controller 62 that cause the droplet generator 12 to be moved to the nozzle priming station 24, where a nozzle assembly is mated with a resilient priming boot (not shown) in a known manner. Using an air cylinder (not shown), a vacuum is then pulled on the boot to suck viscous material from the pressurized syringe 42 and through the nozzle assembly.

Figure 4:
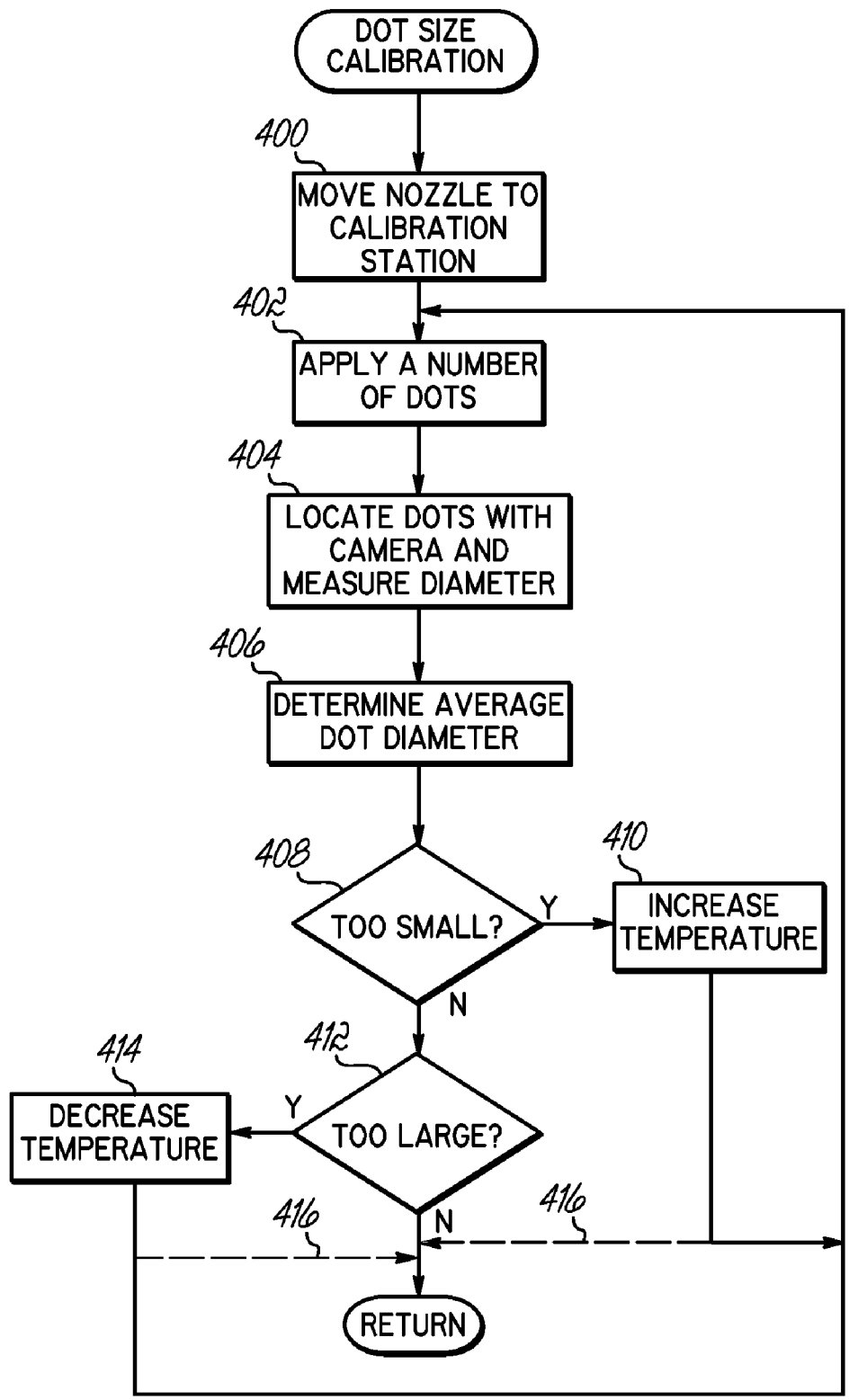
FIG. 4 is a flowchart generally illustrating a dot size calibration process using the viscous material jetting system of FIG. 1.

Thereafter, the computer 18 determines, at 304, whether a dot size calibration is required. A dot size calibration is often executed upon initially beginning a dot dispensing process or any time the viscous material is changed. As will be appreciated, the execution of a dot size calibration is application dependent and can be automatically run at set time intervals, part intervals, with every part, etc. If a dot size calibration is to be run, the computer executes, at 306, a dot size calibration subroutine. Referring to FIG. 4, the computer 18 executes a dot size calibration that is capable of changing the amount of the dispensed material volume and hence, the dot size, by changing the temperature of the viscous material within the nozzle 48, thereby changing viscous material's viscosity and flow characteristics. In a first step of this calibration process, the computer 18 commands, at 400, the motion controller 62 to move the droplet generator 12 to the calibration station 26 such that the nozzle 48 is directly over the work surface 74. Next, at 402, the computer 18 commands the motion controller 62 to cause the droplet generator controller 70 to dispense dots 37a, 37b, 37n (FIG. 2) on the work surface 74. During this calibration process, the dispenser feedrate is not critical, but the dots 37 are applied at a rate that is to be used in the production dispensing process. The computer 18 then, at 404, commands the motion controller 62 to move the camera 16 along the same path along which the dots 37a, 37b, 37n were applied. The computer 18 and vision circuit 64 provide a feedback signal representing a size-related physical characteristic of the applied dot, which in this embodiment is a first edge 82 of a first dot; and the computer 18 stores in the computer memory 54 position coordinates of a point on that first edge 82. With continued motion of the camera along the path, another feedback signal is provided representing a diametrically opposite second edge 84 of the first dot 37a; and position coordinates of a point on the second edge 84 of the first dot 37a are also stored in the computer memory 54. The distance between the two sets of position coordinates represents the diameter or size of the first dot 37a. The above process of detecting dot edges and storing respective position coordinates continues for other dots 37b, 37n on the surface 74. A sufficient number of dots are dispensed and measured by the computer 18 so as to provide a statistically reliable measure of dot diameter. However, as will be appreciated, the diameter of a single applied dot may be measured and used to initiate a dot size calibration.

After all of the dots have been deposited and measured, at 406, the computer 18 then determines the average dot diameter or size and, at 408, determines whether the average dot diameter is smaller than a specified dot diameter. If so, the computer 18 provides, at 410, a command signal to the heater/cooler controller 60 causing the temperature setpoint to be increased by an incremental amount. The heater/cooler controller 60 then turns on the heater 56 and, by monitoring temperature feedback signals from the thermocouple 58, quickly increases the temperature of the nozzle 48 and the viscous material therein to a temperature equal to the new temperature setpoint. When the increased temperature has been achieved, the computer 18 provides command signals to the motion controller 62 to cause the droplet generator 70 to again execute the previously described process steps 402-408. The increased temperature reduces the viscosity of the viscous material, thereby resulting in more material being dispensed and hence, a larger average volume and dot diameter; and that larger average dot diameter is then compared with the specified dot diameter at 408. If the diameter is still too small, the controller 18 again provides command signals, at 410, to again increase the temperature setpoint value. The process of steps 402-410 is iterated until the computer 18 determines that the current average dot diameter is equal to, or within an allowable tolerance of, the specified dot diameter.

If the computer 18 determines, at 408, that the average dot diameter is not too small, then the computer determines, at 412, whether the average dot diameter is too large. If so, it provides, at 414, a command signal to the heater/cooler controller 60 that results in a decrease of the temperature setpoint by an incremental amount. With a reduction in the temperature setpoint, the heater/cooler controller 60 is operative to turn on the cooler 56; and by monitoring the temperature feedback signals from the thermocouple 58, the controller 60 quickly reduces the temperature of the nozzle 48 and the viscous material therein to the new lower temperature setpoint value. By reducing the temperature of the viscous material, its viscosity value increases. Therefore, during a subsequent jetting of a number of dots, a less material is dispensed; and the computer 18 detects a smaller average volume or dot diameter. Again, that process of steps 402-412 iterates until the average dot diameter is reduced to a value equal to, or within an allowable tolerance of, the specified dot diameter.

In the dot size calibration process described above, the computer 18 iterates the process by jetting and measuring successive dots until a specified dot diameter is achieved. In an alternative embodiment, a relationship between a change in temperature and a change in dot size for a particular viscous material can be determined experimentally or otherwise. That relationship can be stored in the computer 18 either as a mathematical algorithm or a table that relates changes in dot size to changes in temperature. An algorithm or table can be created and stored for a number of different viscous materials. Therefore, instead of the iterative process described above, after determining the amount by which the dot diameter is too large or too small, the computer 18 can, at 410 and 414, use a stored algorithm or table to determine a change in temperature that is required to provide the desired change in dot size. After commanding the heater/cooler controller 60 to change the temperature setpoint by that amount, the process ends as indicated by the dashed lines 416. In still further embodiments, the above-described calibration processes and be executed using radii or circumferences of respective dots that are determined from the edges detected by the camera.

Referring back to FIG. 3, after the dot size calibration is complete, the computer 18 then determines, at 308, whether a material volume calibration is required. A material volume calibration is often executed upon initially beginning a dot dispensing process or any time the dispensed weight, dot diameter, dot size or viscous material changes. As will be appreciated, the execution of a material volume calibration is application dependent and can be automatically run at set time intervals, part intervals, with every part, etc. As discussed earlier, for an optimum process, for example, underfilling, bonding, soldering, etc., it is required that an accurate total volume of material be uniformly applied at precise locations. Often, the total material volume is specified by the user and is dependent on the size of the die, the viscous material, its specific gravity, the applied line thickness, the distance between the die and the substrate, the size of a fillet, if applicable, etc. For the total material volume to be uniformly dispensed, an accurate determination of dispenser velocity is required, which is the function of the material volume calibration subroutine.

Figure 5:
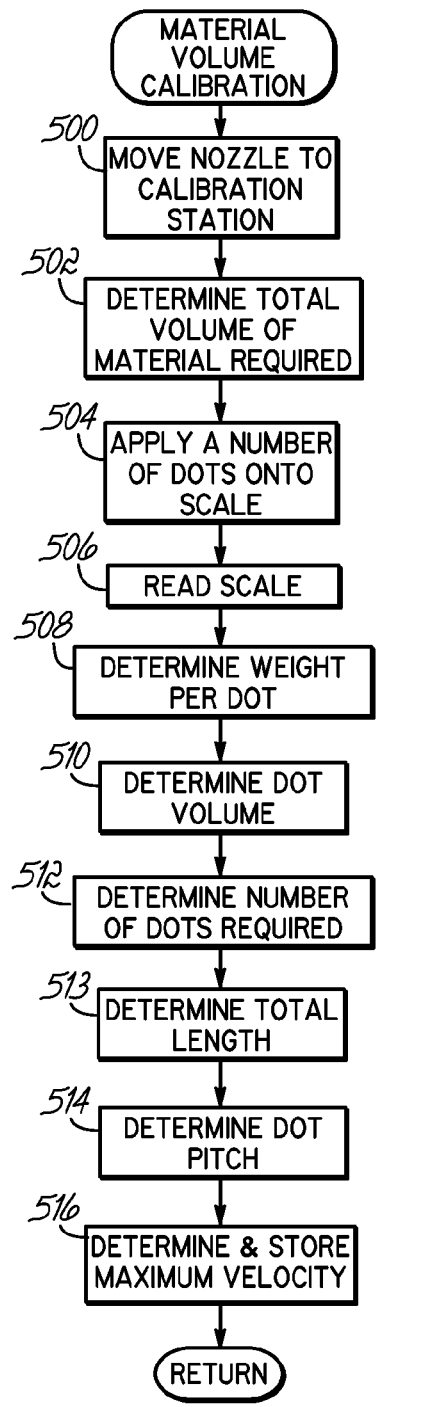
FIG. 5 is a flowchart generally illustrating a material volume calibration process using the viscous material jetting system of FIG. 1.

If the computer 18 determines that a material volume calibration is to be run, the computer 18 then executes, at 310, the material volume calibration subroutine illustrated in FIG. 5. The first step of that process requires that the computer 18 provide command signals, at 500, to move the droplet generator 12 so that the nozzle 48 is over the table 76 of the weigh scale 52. Thereafter, the computer 18 determines, at 502, the total volume of material required. This determination may be made either by reading a user entered value from the memory 54 or determining a total volume using the user entered parameters identified above, for example, line thickness, die size, fillet size, etc. Thereafter, the computer 18 dispenses, at 504, a number of dots onto the table 76 of the weigh scale 52. As will be appreciated, a dispensed dot is normally not detectable within the resolution range of the weigh scale 52. Therefore, a significant number of dots may have to be dispensed in order to provide a statistically reliable measurement of dispensed material weight by the weigh scale 52. However, as will be appreciated, if the scale has a sufficiently high resolution, only a single dot of viscous material can be used to provide the dot size calibration. At the end of the dispensing process, the computer 18 then, at 506, reads or samples a weight feedback signal from the weigh scale 52, which represents the weight of the dispensed dots. Knowing the number of dots dispensed, the computer 18 is then able to determine, at 508, the weight of each dot. Using the specific gravity provided by the user and stored in the computer memory 54, the computer 18 is then able to determine, at 510, the volume of each dot. Knowing the total volume of material required from process step 502 and the volume of each dot, the computer 18 is then able to determine, at 512, the number of dots required to dispense the total volume.

In an underfilling operation, the dots are dispensed along a single line that is immediately adjacent one side of the die. In a die bonding operation, droplets are dispensed in a pattern of lines of viscous material, and the total length is the cumulative length of the lines in the pattern over which the total volume of material is to be dispensed. In either event, the total length value is often provided by a user and stored in the computer memory 54. Thus, the computer 18 is able to determine, at 513, the total length, either by reading it from memory or determining it from a selected dispensing pattern. Knowing the total length and the number of dots, the computer 18 is then able to determine, at 514, the dot pitch, that is, the distance between the centers of the dots. Dot pitch is also a measure of the volume of viscous material per unit length along the path. A maximum dot rate, which is generally a function of the viscosity of the material being dispensed and other application related factors, is determined either by the user, or experimentally, and is stored in the computer memory 54. For optimum production efficiency, it is desirable that the maximum dot rate be used to determine a maximum relative velocity between the dot generator 12 and the substrate 36. Knowing the maximum dot rate and the distance between the dots, the computer 18 is then able to determine and store, at 516, a maximum relative velocity at which the motion controller 62 can command the droplet generator 12 to move with respect to the substrate 36.

In an alternative embodiment of the material volume calibration process of FIG. 5, in some applications, the maximum relative velocity between the droplet generator 12 and the substrate 36 may be determined by the user or other factors, for example, the electromechanical components 38, etc. In that situation, given a desired maximum relative velocity and the dot pitch, the computer 18 is able, at 516, to determine a rate at which the dots are to be dispensed. Assuming that dot rate is equal to or less than the maximum dot rate, the computer 18 can command the droplet generator controller 70 to dispense dots at that rate.

Referring back to FIG. 3, upon completion of the material volume calibration, the computer 18 then determines, at 312, whether a dot placement calibration is required. A dot placement calibration is often executed upon initially beginning a dot dispensing process and any time the maximum velocity or viscous material changes. As will be appreciated, the execution of a dot placement calibration is application dependent and can be automatically run at set time intervals, part intervals, with every part, etc. The droplet generator 12 is often jetting viscous material droplets 34 on-the-fly, that is, while it is moving relative to the substrate 36. Therefore, the viscous material droplets 34 do not vertically drop onto the substrate 36 but instead, have a horizontal motion component prior to landing on the substrate 37. Consequently, the position at which the droplet generator 12 dispenses the material droplet 34 should be offset to compensate for that horizontal displacement of the viscous material droplet 34 prior to landing on the substrate 36. To determine this offset, the computer 18 executes, at 314, a dot placement calibration subroutine illustrated further in FIG. 6.

The computer 18 commands, at 600, the motion controller 62 to cause the droplet generator 12 to move to a location placing the nozzle 48 over the work surface 74 of the calibration station 26. The computer 18 then commands, at 602, the motion controller 62 to cause the droplet generator controller 70 to dispense a line of viscous material dots onto the work surface 74 at the maximum velocity that was determined by the material volume compensation subroutine of FIG. 5. Thereafter, the computer 18 commands, at 604, the motion controller 62 to move the camera 16 along the same path over which the dots were dispensed. In a manner as previously described, the computer 18 and vision circuit 64 detect diametrically opposed edges of the dots; and the computer 18 stores coordinate values of points on the edges. Based on those stored points, the computer determines position coordinates of a center of the dots. The computer 18 then determines, at 606, a difference between a position of the nozzle 48 when a droplet 34 was ejected and a position of a respective dot 37 on the work surface 74. The difference in those two positions is stored as an offset value in the computer memory 54.

Referring to FIG. 3, after the various calibration subroutines have been executed, the computer 18 then commands, at 316, the conveyor controller 66 to operate the conveyor 22 and transport a substrate 36 to a fixed position within the noncontact jetting system 10. In a known manner, an automatic fiducial recognition system locates fiducials on the substrate and corrects for any misalignment to ensure the substrate 36 is accurately placed within the noncontact jetting system 10.

The computer 18 determines, at 318, the position coordinates of the first and last dispense points of the line of viscous material to be deposited and further applies the offset values determined during the dot placement calibration. As will be appreciated, the offset value may be resolved into X and Y components depending on the orientation of the line on the substrate. The computer 18 then determines a distance required to accelerate the droplet generator 12 to the maximum velocity determined during the material volume calibration. Next, a prestart point is defined that is along the path between the first and last points but displaced from the first point by the acceleration distance. Thereafter, the computer 18 commands, at 320, motion controller 62 to move the nozzle 48.

Motion is first commanded to the prestart point, and then motion is commanded to the first dispense point as modified by the offset value. Thus, after reaching the prestart point, the nozzle begins moving along a path between the first and last dispense points. The motion controller 62 then determines, at 326, when the nozzle 48 has been moved to the next dispense point, for example, the first dispense point as modified by the offset value. The motion controller 62 then provides, at 328, a command to the droplet generator controller 70 to operate the jetting valve 40 and dispense the first dot. Thus, the first dot is jetted at a nozzle location offset from the first dispense position, but due to the relative velocity between the droplet generator 12 and the substrate 36, the first dot lands on the substrate at the desired first dispense position.

Thereafter, the dispensing process iterates through steps 322-328 to dispense the other dots. With each iteration, the computer 18 provides commands to the motion controller 62, which cause the droplet generator 12 to move through an incremental displacement equal to the dot pitch. Each successive increment of motion equal to dot pitch represents the next dispense point and is detected by the motion controller 62 at 326. Upon detecting each increment of motion, the motion controller 62 provides, at 328, a command to the droplet generator controller 70 causing a droplet of viscous material to be dispensed. Since the first dispense point was modified by the offset values, the positions of the other incrementally determined dispensed points are also modified by the offset values. Therefore, further dots are applied to the substrate at the desired points.

The motion controller 62 determines when the last dispense point as modified by the offset value has been reached and provides a command to the droplet generator controller 70 to dispense the last dot. The computer 18 determines, at 330, when all of the dots have been dispensed.

Thus, the application of the offset value causes the dispenser 40 to jet a droplet of material 34 at a position in advance of a position at which dispensing would occur if the dispenser were stationary. However, with the dispenser 40 being moved at the maximum velocity and using an offset value determined by the maximum velocity, by jetting the droplet at an advance position determined by the offset value, the jetted droplet 34 lands on the substrate 36 as the dot 37 at its desired location.

It should be noted that in iterating through steps 326-330, a difference exists depending on whether the motion controller 62 is identifying successive dispense points in terms of absolute coordinate values or by the dot pitch. If the motion controller 62 is tracking dot pitch, the offset value is applied to only the first and last dispense points in the line. However, if the motion controller 62 is determining the absolute position values for each of the dispense points, then the offset value is subtracted from the absolute coordinate values for each of the dispense points.

In use, the dot size, material volume and dot placement calibrations are performed at various times depending on the customer specifications, the type of viscous material used, application requirements, etc. For example, all three calibrations are performed upon initially beginning a dot dispensing process for a group of parts, for example, while parts are being loaded and unloaded from the machine. In addition, all three processes are executed any time the viscous material is changed. Further, the calibrations can be automatically run at set time intervals, part intervals or with every part. It should also be noted that if the dispensed weight, dot diameter or dot size changes, the material volume calibration should be re-executed to obtain a new maximum velocity; and further, if the maximum velocity changes, the dot placement calibration should be re-executed to obtain a new offset value.

Dot size calibrations can also be performed to provide a calibration table 83 (FIG. 2) in the memory 54 of the computer 18. The calibration table 83 stores a range of dot sizes that have been calibrated to respective operating parameters, for example, temperature, the stroke of the piston 41 and/or the on-time of the pulse operating the transducer 80, etc. Thus, the calibration table 83 relates a particular dot size to a temperature and/or piston stroke and/or operating pulse width. Further, based on those stored calibrations, the dot size can be changed in real time during a dot dispensing cycle to meet different application demands by appropriately adjusting the piston stroke or operating pulse width as required. Since the various material volumes are known in advance, in one embodiment, the selection of desired dot sizes from the calibration table 83 can be programmed in advance.

As an example of the above, a first portion of the substrate may require a first material volume that, in turn, requires dispensing three dots of a first dot size; and a second portion of the substrate may require a second material volume that is equal to 3.5 of the first dots dispensed on the first portion. Since one-half of a first dot cannot be dispensed, after dispensing the first dots on the first portion, but before dispensing of dots on the second portion, the computer 18 chooses a different, second dot size from the calibration table 83. The second dot size is one which can be divided into the second material volume a whole number of times or without a significant fraction. Then, the computer 18 provides commands to the droplet generator controller 70 to adjust the piston stroke or change the operating pulse width to provide the second dot size during the dispensing of dots on the second portion of the substrate, thereby dispensing the second material volume.

Although dots of one size are most often dispensed over an area of the substrate to achieve the desired material volume, in an alternative application, the desired material volume may be more accurately achieved by dispensing dots of a first size over the area and then dispensing dots of a second size over the same area. Thus, piston strokes or operating pulse on-times corresponding to the respective first and second size dots can be read from the calibration table and appropriate adjustments made between dot dispensing cycles.

Alternatively, in some applications, the desired material volume may change based on changes detected from one substrate to another or in the dot dispensing process. In those applications, upon detecting a change in the desired material volume, the computer 18 can scan the calibration table 83 and select a dot size that upon being dispensed, provides the changed desired material volume. As will be appreciated, the same parameter does not have to be used with the selection of each dot size. For example, some dot sizes may practically be more accurately or easily achieved with a piston stroke adjustment, and other dot sizes may be more readily achieved with an operating on-time pulse adjustment. The choice of which parameter to use will be determined by the capabilities and characteristics of the dispensing gun, the material being dispensed and other application related factors. As will further be appreciated, temperature can also be used to adjust dot sizes in a dot dispensing process, but the longer response time required to achieve a dot size change resulting from a temperature change makes the use of temperature less practical.

The noncontact jetting system 10 more accurately applies on-the-fly, viscous material dots on a substrate. First, the noncontact jetting system 10 has a temperature controller 86 that includes separate devices 56, 57 for, respectively, increasing and decreasing the temperature of the nozzle 48, so that the temperature of the viscous material is accurately controlled while it is in the nozzle 48. Second, the ability to actively heat or cool the nozzle permits the dispensed volume or dot size to be adjusted by changing the temperature of the nozzle 48. Further, as will subsequently be described, the dispensed volume or dot size can be changed by adjusting the stroke of the piston 41 or the on-time of the pulse operating the transducer 80. This has an advantage of a simpler and less expensive system with a faster response time for calibrating dot size. Further, the noncontact jetting system 10 permits a relative velocity between the nozzle 48 and the substrate 36 to be automatically optimized as a function of the viscous material dispensing characteristics and a specified total volume of material to be used on the substrate. Further, the maximum velocity can be automatically and periodically recalibrated with the advantage of providing a more accurate dispensing a desired total amount of viscous material on the substrate. In addition, the noncontact jetting system 10 optimizes the positions at which respective dots are to be dispensed on-the-fly as a function of the relative velocity between the nozzle and the substrate. Thus, a further advantage is that viscous material dots are accurately located on the substrate.

While the invention has been illustrated by the description of one embodiment and while the embodiment has been described in considerable detail, there is no intention to restrict nor in any way limit the scope of the appended claims to such detail. Additional advantages and modifications will readily appear to those who are skilled in the art. For example, in the described embodiment, the dot size, material volume and dot placement calibrations are described as fully automatic calibration cycles. As will be appreciated, in alternative embodiments, those calibrations processes may be changed to permit of user activity depending on the application and preferences of the user.

Figure 6:
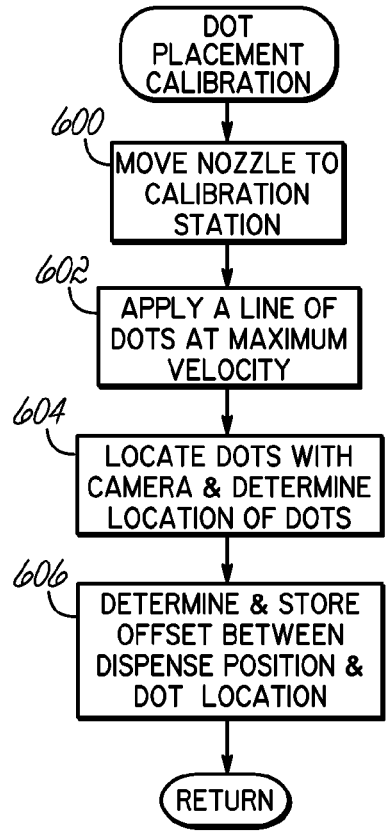
FIG. 6 is a flowchart generally illustrating a dot placement calibration process using the viscous material jetting system of FIG. 1.
Figure 7:
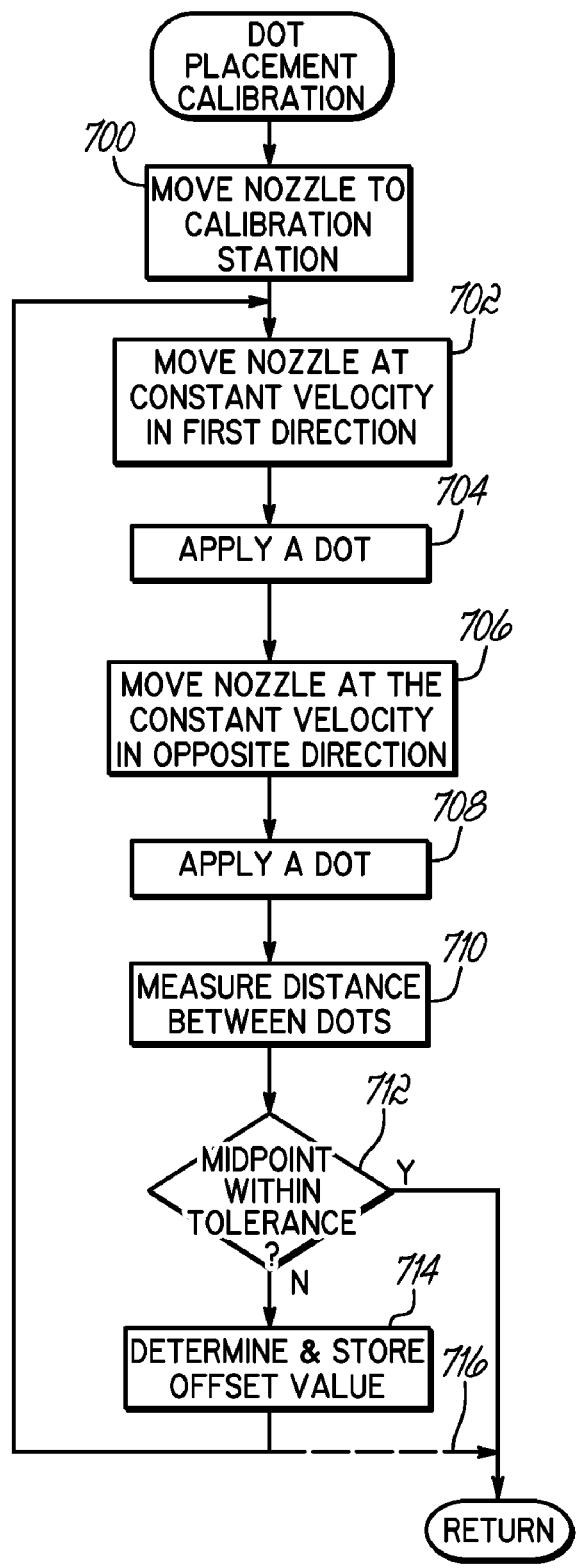
FIG. 7 is a flowchart generally illustrating an alternative embodiment of a dot placement calibration process using the viscous material jetting system of FIG. 1.

FIG. 6 illustrates one embodiment of a dot placement calibration subroutine. As will be appreciated, other embodiments may provide other calibration processes. For example, an alternative dot placement calibration subroutine is illustrated in FIG. 7. In this calibration process, the computer first, at 700, commands the motion controller 62 to move the droplet generator 12 to position the nozzle 48 over the work surface 74. Thereafter, the computer commands, at 702, the motion controller 62 to move the droplet generator 12 at a constant velocity in a first direction. Simultaneously, the computer commands, at 704, the droplet generator controller 70 to operate the jetting valve 44 and apply a viscous material dot at a reference position. Next, the computer 18 commands, at 706, the motion controller 62 to move the droplet generator 12 at the constant velocity in an opposite direction. The computer 18 simultaneously commands, at 708, the droplet generator controller 70 to apply a dot of viscous material at the reference position. The result is that two dots of viscous material are applied to the work surface 74. With all conditions being substantially the same during the two jetting processes, the midpoint between the dots should be located at the reference position.

Next, the computer 18 commands, at 710, the motion controller to move the camera over the two dots, that is, along the same path used to apply the dots. During that motion, the computer 18 and vision circuit 64 are able to monitor the image from the camera 16 and determine coordinate values for diametrically opposite points on the respective edges of each of the dots. Given those points, the computer 18 can then determine the distance between the dots and a midpoint between the dots. The computer 18 then determines, at 712, whether the midpoint is located within a specified tolerance of the reference position. If not, the computer 18 is then able to determine and store, at 714, an offset value. The offset value should be substantially equal to one-half of the measured distance between the dots. To confirm the accuracy of the offset value, the steps 702-712 can be repeated. However, at steps 704 and 708, the position at which the computer 18 commands the droplet generator controller to jet a droplet is offset by the value determined at step 714. If the computer determines, at 712, that the distance is still not within the tolerance, the process of steps 702-714 are repeated until an offset value providing an acceptable distance is determined. Alternatively, if there is a higher level of confidence in the dot placement calibration subroutine, after determining and storing the offset value at 714, the process can simply return to the operating cycle of FIG. 3 as indicated by the dashed line 716.

In an alternative embodiment, knowing the velocity of the droplet generator 12 and the distance between the dots, the computer 18 can determine a time advance offset. That is, the increment of time that the ejection of the viscous material droplet 34 should be advanced prior to the droplet generator 12 reaching the reference position.

Figure 8:
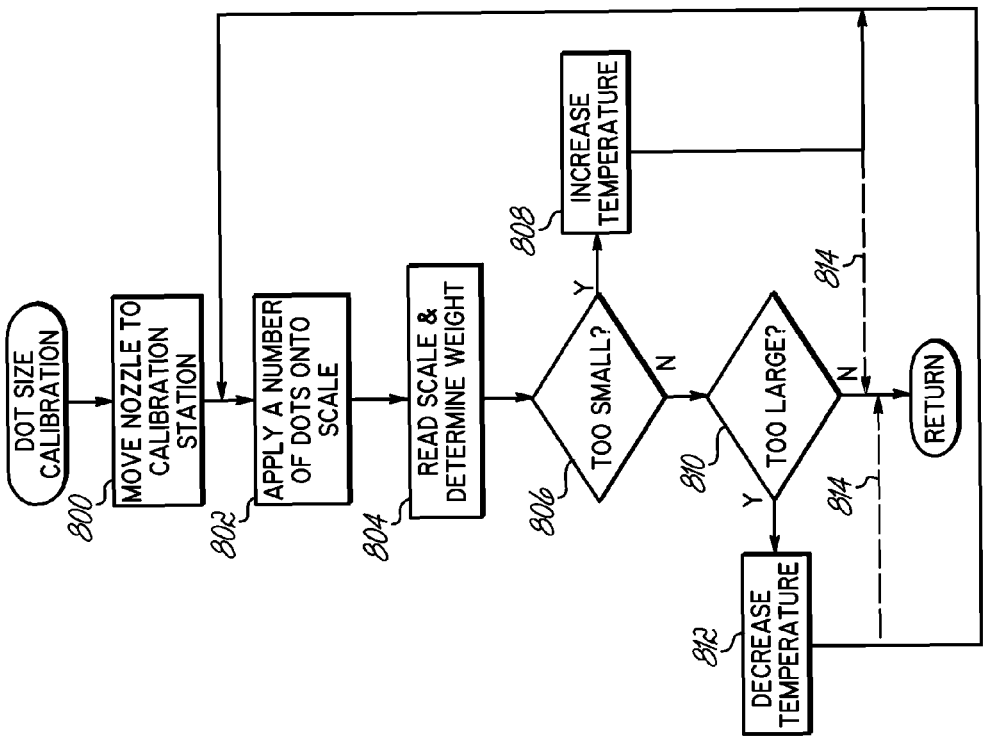
FIG. 8 is a flowchart generally illustrating an alternative embodiment of a dot size calibration process using the viscous material jetting system of FIG. 1.

FIG. 4 illustrates one embodiment of a dot size calibration subroutine. As will be appreciated, other embodiments may provide other calibration processes, for example, an alternative dot placement calibration subroutine is illustrated in FIG. 8. As with the calibration process described in FIG. 4, the computer 18 executes a dot size calibration that changes dot size or volume by changing the temperature of the viscous material within the nozzle 48, thereby changing viscous material's viscosity and flow characteristics. However, the process of FIG. 8 uses the weigh scale 52 instead of the camera 16 as a measurement device. In a first step of this calibration process, the computer 18 commands, at 800, the motion controller 62 to move the droplet generator 12 to the calibration station 52 such that the nozzle 48 is directly over the table 76 of the scale 52. Next, at 802, the computer 18 commands the droplet generator controller 70 to dispense dots onto the table 76. As will be appreciated, a dispensed dot is often not detectable within the resolution range of the weigh scale 52. Therefore, a significant number of dots may have to be dispensed in order to provide a statistically reliable measurement of dispensed material weight by the weigh scale 52. However, if the scale has a sufficiently high resolution, only a single applied dot of viscous material can be used for the dot size calibration.

At the end of the dispensing process, the computer 18 then, at 804, samples a weight feedback signal from the weigh scale 52, which represents the weight of the dispensed dots. The computer 18 then compares, at 806, the dispensed weight to a specified weight stored in the computer memory 54 and determines whether the dispensed weight is less than the specified weight. If so, the computer 18 provides, at 808, a command signal to the heater/cooler controller 60 causing the temperature setpoint to be increased by an incremental amount. The heater/cooler controller 60 then turns on the heater 56 and, by monitoring temperature feedback signals from the thermocouple 58, quickly increases the temperature of the nozzle 48 and the viscous material therein to a temperature equal to the new temperature setpoint. When increased temperature has been achieved, the computer 18 provides command signals to the motion controller 62 and droplet generator 70 to again execute the previously described process steps 802-806. The increased temperature reduces the viscosity of the viscous material, thereby resulting in each dot having a larger volume and weight as well as a larger dot diameter; and that larger weight is again compared with the specified dot diameter at 806. If the dispensed weight is still too small, the controller 18 again provides command signals, at 808, to again increase the temperature setpoint value. The process of steps 802-808 are iterated until the computer 18 determines that the current dispensed weight is equal to, or within an allowable tolerance of, the specified weight.

If the computer 18 determines, at 806, that the dispensed weight is not too small, it then determines, at 810, whether the dispensed weight is too large. If so, the computer 18 provides, at 812, a command signal to the heater/cooler controller 60 that results in a decrease of the temperature setpoint by an incremental amount. With a reduction in the temperature setpoint, the heater/cooler controller 60 is operative to turn on the cooler 56; and by monitoring the temperature feedback signals from the thermocouple 58, the temperature of the nozzle 48 and the viscous material therein is quickly reduced to a temperature equal to the new lower temperature setpoint value. By reducing the temperature of the viscous material, its viscosity increases; and therefore, during a subsequent dispensing operation, each dot will have less volume and weight as well as a smaller diameter. Again, that process of steps 802-812 iterates until the dispensed weight is reduced to a value equal to, or within an allowable tolerance of, the specified weight.

In the dot size calibration process described in FIG. 8, the computer 18 iterates the process by dispensing and measuring dispensed weights until a specified weight is achieved. In an alternative embodiment, a relationship between a change in temperature and a change in dispensed weight for a particular viscous material can be determined experimentally or otherwise. That relationship can be stored in the computer 18 either as a mathematical algorithm or a table that relates changes in dispensed weight to changes in temperature. An algorithm or table can be created and stored for a number of different viscous materials. Therefore, instead of the iterative process described above, after determining the amount by which the dispensed weight is too large or too small, the computer 18 can, at 808 and 812, use a stored algorithm or table to determined a change in temperature that is required to provide the desired change in dispensed weight. After commanding the heater/cooler controller 60 to change the temperature setpoint by that amount, the process ends as indicated by the dashed lines 814. The dot size calibration process described above can also be executed on a dispensed dot weight basis. Knowing the number of dots dispensed, the computer 18 is then able to determine, at 804, an average weight of each dot dispensed.

Figure 9:
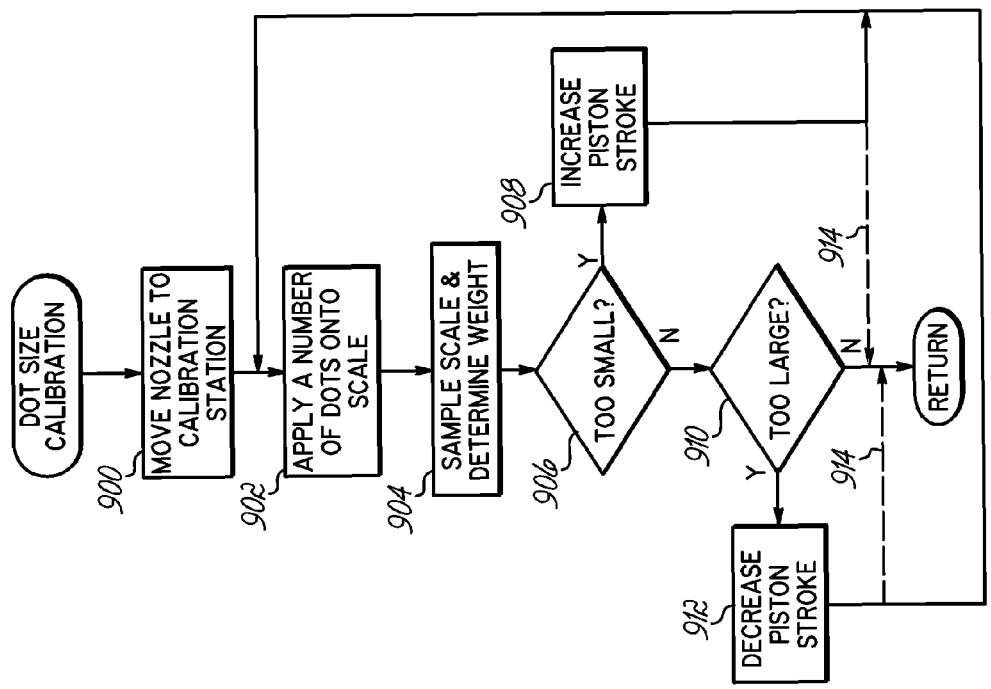
FIG. 9 is a flowchart generally illustrating a further alternative embodiment of a dot size calibration process using the viscous material jetting system of FIG. 1.

A further alternative embodiment of the dot placement calibration subroutine is illustrated in FIG. 9. As with the calibration process described in FIG. 8, the computer 18 executes a dot size calibration that changes dot size or volume based on a feedback signal from the weigh scale 52. However, in the process of FIG. 9, the dot size is adjusted by adjusting the stroke of the piston 41 of the control valve 44 in the dispenser 40. In a first step of this calibration process, the computer 18 commands, at 900, the motion controller 62 to move the droplet generator 12 to the calibration station 52 such that the nozzle 48 is directly over the table 76 of the scale 52. Next, at 902, the computer 18 commands the droplet generator controller 70 to dispense dots onto the table 76. As will be appreciated, a dispensed dot is often not detectable within the resolution range of the weigh scale 52. Therefore, a significant number of dots may have to be dispensed in order to provide a statistically reliable measurement of dispensed material weight by the weigh scale 52. However, if the scale has a sufficiently high resolution, only a single applied dot of viscous material can be used for the dot size calibration.

At the end of the dispensing process, the computer 18 then, at 904, samples a feedback signal from the weigh scale 52, which represents the weight of the dispensed dots. The computer 18 then compares, at 906, the dispensed weight to a specified weight stored in the computer memory 54 and determines whether the dispensed weight is less than the specified weight. If so, the computer 18 provides, at 908, an increase piston stroke command to the droplet generator controller 70, which causes the controller 70 to operate the motor 61 in a direction to move the micrometer screw 53 vertically upward as viewed in FIG. 2. The computer 18 then provides command signals to the motion controller 62 and droplet generator 70 to again execute the previously described process steps 902-906. The increased piston stroke results in each dot dispensed having a larger volume and weight as well as a larger dot diameter. The cumulative larger weight of all of the dots dispensed is again compared with the specified weight at 906. If the diameter is still too small, the controller 18 again provides an increase piston stroke command signal, at 908, that results in the micrometer screw 53 being moved by the motor 61 further upward. The process of steps 902-908 are iterated until the computer 18 determines that the current dispensed weight is equal to, or within an allowable tolerance of, the specified weight.

If the computer 18 determines, at 906, that the dispensed weight is not too small, it then determines, at 910, whether the dispensed weight is too large. If so, the computer 18 provides, at 912, a decrease piston stroke command signal to the droplet generator controller 70 that results in the motor 61 moving the micrometer screw 53 vertically downward as viewed in FIG. 2. With a smaller piston stroke, during a subsequent dispensing operation, each dot dispensed will have a lesser volume and weight as well as a smaller diameter. Again, the process of steps 902-912 iterates until the dispensed weight is reduced to a value equal to, or within an allowable tolerance of, the specified weight.

In the dot size calibration process of FIG. 9, the computer 18 iterates the process by dispensing and measuring dispensed weights until a specified weight is achieved. In an alternative embodiment, a relationship between a change piston stroke and a change in dispensed weight for a particular viscous material can be determined experimentally or otherwise. That relationship can be stored in the computer 18 either as a mathematical algorithm or a table that relates changes in dispensed weight to changes in piston stroke. An algorithm or table can be created and stored for a number of different viscous materials. Therefore, instead of the iterative process described above, after determining the amount by which the dispensed weight is too large or too small, the computer 18 can, at 908 and 912, use a stored algorithm or table to determined a change in piston stroke that is required to provide the desired change in dispensed weight. After commanding the droplet generator controller 70 to change the piston stroke by that amount, the process ends as indicated by the dashed lines 914. The dot size calibration process described above can also be executed on a dispensed dot weight basis. Knowing the number of dots dispensed, the computer 18 is then able to determine, at 904, an average weight of each dot dispensed.

As will be appreciated, in another alternative embodiment, in a process similar to that described in FIG. 9, the dispensed weight of the viscous material can also be changed by adjusting the on-time of the pulse applied to the transducer 80 that operates the jetting valve 44. For example, at step 908, in response to detecting that the dispensed weight is too small, the computer 18 can command the droplet generator controller 70 to increase the on-time of the signal operating the transducer 80. With the increased on-time, more material is dispensed, thereby increasing the dispensed weight and dot size. Similarly, at step 912, in response to detecting that the dispensed weight is too large, the computer 18 can command the droplet generator controller 70 to decrease the on-time of the signal operating the transducer 80. With the decreased on-time, less material is dispensed, thereby decreasing the dispensed weight and dot size.

While the invention has been illustrated by a description of several embodiments and while those embodiments have been described in considerable detail, there is no intention to restrict, or in any way limit the scope of the appended claims to such detail. Additional advantages and modifications will readily appear to those who are skilled in the art. For example, calibration routines are described as jetting dots of viscous material onto the stationary surface 74; however, as will be appreciated, in alternative embodiments, the calibration cycles can be executed by jetting viscous material dots onto the substrate 36. Therefore, the invention in its broadest aspects is not limited to the specific details shown and described. Consequently, departures may be made from the details described herein without departing from the spirit and scope of the claims which follow.

What is claimed is:

1. A method of dispensing viscous material onto a substrate from a dispenser which is operable to apply dots of viscous material onto the substrate in a noncontact fashion wherein each dot of viscous material discharged from the dispenser releases from the dispenser and moves away from the dispenser without requiring a wetting of the substrate to pull the dot of viscous material from the nozzle, the method comprising the steps of:

a. providing a target value representing a target weight of the viscous material to be dispensed onto the substrate and a length value representing a length over which the target value is be dispensed onto the substrate;

b. operating the dispenser to apply a first plurality of dots of viscous material onto a calibration surface of a weigh scale in a non-wetting manner, wherein during this step the dispenser is supported by a positioner while applying the first plurality of dots of viscous material onto the calibration surface;

c. generating a feedback signal from the weigh scale representing the weight of viscous material contained in the first plurality of dots of viscous material applied onto the calibration surface and weighed by the weigh scale;
d. using the feedback signal to determine a velocity value of relative motion between the dispenser and the substrate which will result in the target amount of viscous material being dispensed onto the substrate over the length represented by the length value as a second plurality of dots of viscous material wherein determining the velocity value includes the steps of:
   i. determining a total number of dots required to substantially equal the target value by determining the average weight of the dots applied to the calibration surface, and dividing the average weight of each dot into the target value;
   ii. determining a distance between each of the total number of dots required to distribute the dots over the length represented by the length value, wherein the dots are substantially uniformly distributed over the length represented by the length value;
   iii. determining a rate at which the total number of dots are to be dispensed from the dispenser; and
   iv. using the rate at which the total number of dots are to be dispensed and the distance between each of the dots in the total number of dots to determine a relative velocity between the dispenser and the substrate which will result in the total number of dots required being dispensed over the length represented by the length value; and
e. moving the dispenser over the substrate at the velocity value during a subsequent operation of the dispenser and applying the second plurality of dots of viscous material onto the substrate in a non-wetting manner and at the determined rate over the length represented by the length value, wherein during this step the dispenser is supported by a positioner to apply the second plurality of dots of viscous material onto the substrate.

2. The method of claim 1 wherein the step of determining the total number of dots required comprises determining the average volume of each dot using the average weight value and a specific gravity value, and dividing the average volume of each dot into the target value.

3. The method of claim 1 wherein the method is used for an underfill operation where the second plurality of dots of viscous material are dispensed along at least one side of a die.

4. The method of claim 1 wherein the method is used for a die bonding operation wherein the second plurality of dots of viscous material are dispensed along two or more lines and wherein the length value is substantially equal to the cumulative length of the two or more lines.

5. The method of claim 1 wherein the step of determining the relative velocity comprises determining the maximum velocity that the dispenser can be moved relative to the substrate to apply the second plurality of dots of viscous material to the substrate.

6. The method of claim 1 wherein the step of moving the dispenser over the substrate at the velocity value to apply the second plurality of dots of viscous material onto the substrate over the length represented by the length value causes a line of viscous material to be formed on the substrate.

7. The method of claim 1, further comprising:
   determining a maximum rate at which dots can be dispensed from the dispenser; and
   comparing the maximum rate to the rate at which the total number of drops are to be dispensed.

* * * * *

UNITED STATES PATENT AND TRADEMARK OFFICE
CERTIFICATE OF CORRECTION

Page 1 of 2

PATENT NO. : 7,939,125 B2
APPLICATION NO. : 12/940360
DATED : May 10, 2011
INVENTOR(S) : Ron Abernathy et al.

It is certified that error appears in the above-identified patent and that said Letters Patent is hereby corrected as shown below:

Column 5

Line 58, after "can" insert --be--.

Column 6

Line 19, change "of" to --or--.

Line 66, delete "and".

Column 10

Line 3, change "and" to --can--.

Column 14

Line 42, after "dispensing" insert --of--.

Line 52, change "nor" to --or--.

Line 59, delete "of".

Column 15

Line 35, change "are" to --is--.

Column 16

Line 27, change "are" to --is--.

Column 17

Line 44, change "are" to --is--.

Signed and Sealed this
Nineteenth Day of July, 2011

David J. Kappos
*Director of the United States Patent and Trademark Office*

CERTIFICATE OF CORRECTION (continued)
U.S. Pat. No. 7,939,125 B2

Column 18

Claim 1, line 59, after "is" insert --to--.